(12) United States Patent
Chugh et al.

(10) Patent No.: US 10,151,027 B2
(45) Date of Patent: Dec. 11, 2018

(54) PLASMA-ENHANCED CHEMICAL VAPOR DEPOSITION METHODS FOR GRAPHENE DEPOSITION

(71) Applicant: Purdue Research Foundation, West Lafayette, IN (US)

(72) Inventors: Sunny Chugh, West Lafayette, IN (US); Ruchit Mehta, Hillsboro, OR (US); Zhihong Chen, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 15/447,065

(22) Filed: Mar. 1, 2017

(65) Prior Publication Data
US 2017/0253962 A1 Sep. 7, 2017

Related U.S. Application Data

(60) Provisional application No. 62/302,361, filed on Mar. 2, 2016.

(51) Int. Cl.
| | |
|---|---|
| *C23C 16/26* | (2006.01) |
| *C23C 16/505* | (2006.01) |
| *C23C 16/02* | (2006.01) |
| *H01J 37/32* | (2006.01) |
| *H01L 29/16* | (2006.01) |
| *C01B 32/182* | (2017.01) |
| *C01B 32/186* | (2017.01) |
| *C01B 32/184* | (2017.01) |
| *H01L 21/02* | (2006.01) |

(52) U.S. Cl.
CPC ............ *C23C 16/26* (2013.01); *C01B 32/182* (2017.08); *C01B 32/184* (2017.08); *C01B 32/186* (2017.08); *C23C 16/0227* (2013.01); *C23C 16/505* (2013.01); *H01J 37/32082* (2013.01); *H01L 21/0237* (2013.01); *H01L 21/0242* (2013.01); *H01L 21/0262* (2013.01); *H01L 21/02378* (2013.01); *H01L 21/02381* (2013.01); *H01L 21/02395* (2013.01); *H01L 21/02433* (2013.01); *H01L 21/02527* (2013.01); *H01L 29/1608* (2013.01)

(58) Field of Classification Search
None
See application file for complete search history.

(56) References Cited

U.S. PATENT DOCUMENTS

2015/0311526 A1* 10/2015 Izuhara ................. H01M 4/133
429/231.8

OTHER PUBLICATIONS

E.M. Gallo et al., Proc. SPIE, vol. 8462, pp. 846203-1 to 846203-7. (Year: 2012).*
Z. Bo et al., Nanoscale, vol. 5, pp. 5180-5204. (Year: 2013).*
(Continued)

Primary Examiner — Jiong-Ping Lu
(74) Attorney, Agent, or Firm — Piroozi-IP, LLC

(57) ABSTRACT

A graphene deposition process. The process includes the steps of placing a substrate into a deposition chamber and heating the chamber, generating radio frequency plasma at a location proximate to the substrate while flowing a precursor gas containing carbon through the plasma and over the substrate.

12 Claims, 17 Drawing Sheets

(56) References Cited

OTHER PUBLICATIONS

Ferrari AC, Meyer JC, Scardaci V, Casiraghi C, Lazzeri M, Mauri F, et al. Raman Spectrum of Graphene and Graphene Layers. Phys Rev Lett 2006;97:1-4.
Ferrari AC. Raman Spectroscopy of Graphene and Graphite: Disorder, Electron-Phonon Coupling, Doping and Nonadiabatic Effects. Solid State Commun 2007;143:47-57.
Mak KF, Sfeir MY, Wu Y, Lui CH, Misewich JA, Heinz TF. Measurement of the Optical Conductivity of Graphene. Phys Rev Lett 2008;101:196405.
Lenski DR, Fuhrer MS. Raman and Optical Characterization of Multilayer Turbostratic Graphene Grown via Chemical Vapor Deposition. J Appl Phys 2011;110:013720.
Jia C, Jiang J, Gan L, Guo X. Direct Optical Characterization of Graphene Growth and Domains on Growth Substrates. Sci Rep 2012;2:707.
Li X, Cai W, Colombo L, Ruoff RS. Evolution of Graphene Growth on Ni and Cu by Carbon Isotope Labeling. Nano Lett 2009;9:4268-72.
Choi J-H, Li Z, Cui P, Fan X, Zhang H, Zeng C, et al. Drastic Reduction in the Growth Temperature of Graphene on Copper via Enhanced London Dispersion Force. Sci Rep 2013;3:1925.
Krishnan RS. Raman Spectrum of Quartz. Nature 1945;155:452.
Wood JD, Schmucker SW, Lyons AS, Pop E, Lyding JW. Effects of Polycrystalline Cu Substrate on Graphene Growth by Chemical Vapor Deposition. Nano Lett 2011;11:4547-54.
Vlassiouk I, Smirnov S, Regmi M, Surwade SP, Srivastava N, Feenstra R, et al. Graphene Nucleation Density on Copper: Fundamental Role of Background Pressure. J Phys Chem C 2013;117:18919-26.
Zhao J, Shaygan M, Eckert J, Meyyappan M, RU Mmeli MH. A Growth Mechanism for Free-Standing Vertical Graphene. Nano Lett 2014;14:3064-71.
Y.S. Kim, J.H. Lee, Y.D. Kim, S.-K. Jerng, K. Joo, E. Kim, et al., Methane as an Effective Hydrogen Source for Single-Layer Graphene Synthesis on Cu Foil by Plasma Enhanced Chemical Vapor Deposition, Nanoscale. 5 (2013) 1221-6.
S. Chen, L. Brown, M. Levendorf, W. Cai, S.-Y. Ju, J. Edgeworth, et al., Oxidation Resistance of Graphene-Coated Cu and Cu/Ni Alloy, ACS Nano. 5 (2011) 1321-7.
Novoselov KS, Geim AK, Morozov SV, Jiang D, Zhang Y, Dubonos SV, et al. Electric Field Effect in Atomically Thin Carbon Films. Science 2004;306:666-9.
Huang X, Yin Z, Wu S, Qi X, He Q, Zhang Q, et al. Graphene-Based Materials: Synthesis, Characterization, Properties, and Applications. Small 2011;7:1876-902.
Geim AK, Novoselov KS. The Rise of Graphene. Nat Mater 2007;6:183-91.
Lee C, Wei X, Kysar JW, Hone J. Measurement of the Elastic Properties and Intrinsic Strength of Monolayer Graphene. Science 2008;321:385-8.
Berger C, Song Z, Li X, Wu X, Brown N, Naud C, et al. Electronic Confinement and Coherence in Patterned Epitaxial Graphene. Science 2006;312:1191-6.
Stankovich S, Dikin DA, Piner RD, Kohlhaas KA, Kleinhammes A, Jia Y, et al. Synthesis of Graphene-Based Nanosheets via Chemical Reduction of Exfoliated Graphite Oxide. Carbon 2007;45:1558-65.
Li X, Cai W, An J, Kim S, Nah J, Yang D, et al. Large-Area Synthesis of High-Quality and Uniform Graphene Films on Copper Foils. Science 2009;324:1312-4.
Bae S, Kim H, Lee Y, Xu X, Park J-S, Zheng Y, et al. Roll-to-Roll Production of 30-Inch Graphene Films for Transparent Electrodes. Nat Nanotechnol 2010;5:574-8.
Kim KS, Zhao Y, Jang H, Lee SY, Kim JM, Kim KS, et al. Large-Scale Pattern Growth of Graphene Films for Stretchable Transparent Electrodes. Nature 2009;457:706-10.
Sutter PW, Flege J-I, Sutter EA. Epitaxial Graphene on Ruthenium. Nat Mater 2008;7:406-11.
Fujita T, Kobayashi W, Oshima C. Novel Structures of Carbon Layers on a Pt(111) Surface. Surf Interface Anal 2005;37:120-3.
Coraux J, N'Diaye AT, Busse C, Michely T. Structural Coherency of Graphene on Ir(111). Nano Lett 2008;8:565-70.
Reina A, Jia X, Ho J, Nezich D, Son H, Bulovic V, et al. Large Area, Few-Layer Graphene Films on Arbitrary Substrates by Chemical Vapor Deposition. Nano Lett 2009;9:30-5.
Kim J, Ishihara M, Koga Y, Tsugawa K, Hasegawa M, Iijima S. Low-Temperature Synthesis of Large-Area Graphene-Based Transparent Conductive Films Using Surface Wave Plasma Chemical Vapor Deposition. Appl Phys Lett 2011;98:091502.
Zhang L, Shi Z,Wang Y, Yang R, Shi D, Zhang G. Catalyst-Free Growth of Nanographene Films Onvarious Substrates.Nano Res 2010;4:315-21.
Wei D, Lu Y, Han C, Niu T, Chen W, Wee ATS. Critical Crystal Growth of Graphene on Dielectric Substrates at Low Temperature for Electronic Devices. Angew Chem Int Ed Engl 2013;52:14121-6.
Kim YS, Joo K, Jerng S-K, Lee JH, Yoon E, Chun S-H. Direct Growth of Patterned Graphene on SIO2 Substrates Without the Use of Catalysts or Lithography. Nanoscale 2014;6:10100-5.
Medina H, Lin Y-C, Jin C, Lu C-C, Yeh C-H, Huang K-P, et al. Metal-Free Growth of Nanographene on Silicon Oxides for Transparent Conducting Applications. Adv Funct Mater 2012;22:2123-8.
Munoz R, Gomez-Aleixandre C. Fast and Non-Catalytic Growth of Transparent and Conductive Graphene-Like Carbon Films on Glass at Low Temperature. J Phys D Appl Phys 2014;47:045305.

* cited by examiner

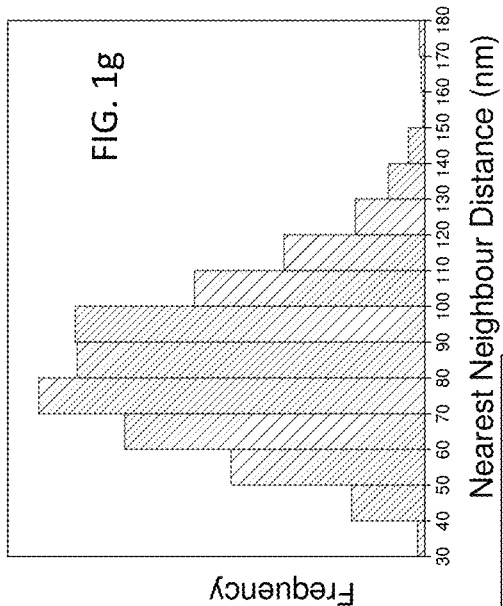
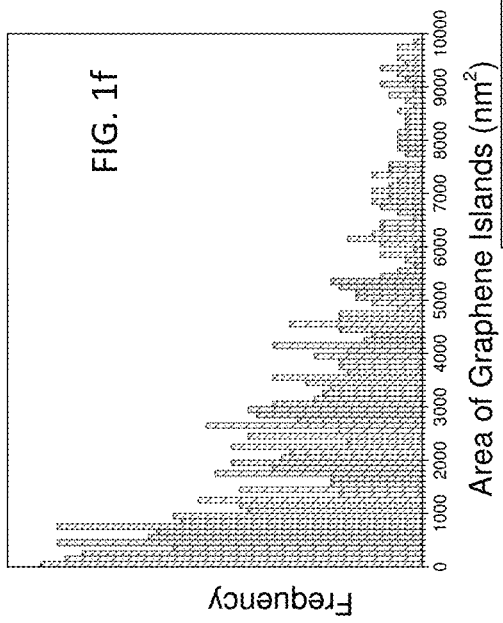
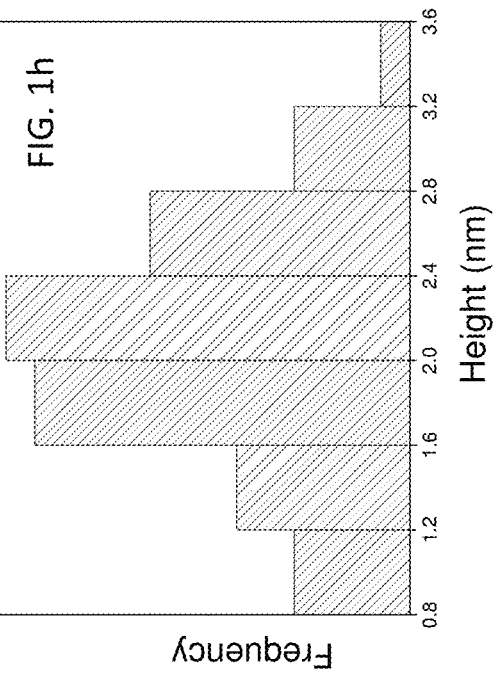

PLASMA-ENHANCED CHEMICAL VAPOR DEPOSITION METHODS FOR GRAPHENE DEPOSITION

CROSS-REFERENCE TO RELATED APPLICATIONS

The present application claims the benefit of U.S. Prov. Pat. App. No. 62/302,361, filed Mar. 2, 2016, the contents of which is hereby incorporated by reference in its entirety into this disclosure.

TECHNICAL FIELD

The present disclosure relates to a method of fabricating graphene, and particularly to a process based on utilizing plasma enhanced chemical vapor deposition (PECVD) on various substrates.

BACKGROUND

This section introduces aspects that may help facilitate a better understanding of the disclosure. Accordingly, these statements are to be read in this light and are not to be understood as admissions about what is or is not prior art.

In its various forms, graphene has garnered widespread interest for use in a number of applications, primarily due to its favorable combination of high electrical and thermal conductivity values, good mechanical strength, and unique optical and electronic properties. Of particular interest to industry are large-area graphene films for applications such as, for example, special barrier layers, coatings, large area conductive elements (e.g., RF radiators or antennas), and flexible electronics. A number of contemplated graphene applications have also been proposed for carbon nanotubes, since these two materials have certain properties that are comparable to one another. However, an advantage of graphene over carbon nanotubes is that graphene can generally be produced in bulk much more inexpensively than can the latter, thereby addressing perceived supply and cost issues that have been commonly associated with carbon nanotubes.

Graphene is composed of carbon atoms and is fabricated in atomically thin layers in which the carbon atoms reside at regular two-dimensional lattice positions. As a result of its high electrical and thermal conductivity properties, as well as its excellent mechanical properties, graphene has garnered a significant amount of interest. In particular, graphene represents an excellent conductive material allowing electrons to move substantially faster and in higher current densities than other competing materials, as well as having an excellent elasticity, flexibility, and transparency making graphene an excellent material for use in the semiconductor and electronics industries.

Various methods of synthesizing graphene are known. One such method is mechanical exfoliation which suffers from low throughput since it can only yield small size flakes with random distribution. Another method is based on SiC growth which poses difficulties in transferring graphene to other substrates. Other approaches such as chemical methods, e.g., graphene oxide reduction, have inadequate scalability and do not provide a suitable control over layer count.

Despite the fact that graphene is generally synthesized more easily than are carbon nanotubes, there remain issues with production of graphene in quantities sufficient to support various commercial operations. Scalability to produce large area graphene films represents a particular problem. The most scalable processes developed to date for making graphene films utilize chemical vapor deposition (CVD) technology. In typical CVD processes, a carbon-containing gas is decomposed at high temperatures into various reactive carbon species, which then deposit upon a suitable growth catalyst and reorganize to form a graphene film. It should be noted that in the present disclosure, the term deposition and growth or variation of these terms are used interchangeably and are intended to mean growth by deposition of graphene on a surface. In typical CVD graphene syntheses, a carbon-containing gas and a copper-containing substrate are heated to a high temperature (e.g., about 900° C.-1000° C.) that is just below the melting point of the copper (i.e., 1061° C.). Both metallic copper substrates and copper-coated substrates can be used (e.g., nickel or silicon carbide substrates coated with copper). It should be noted that while copper has been specifically identified here other metallic substrate or metallic coated substrates can also be used, e.g., Ni, Pt, and Ir. The CVD growth process can take place at either atmospheric pressure or a sub-atmospheric pressure. Due to the high temperatures employed in typical CVD processes, as well as the common use of reduced pressures during growth, scaling to afford graphene growth over large substrate areas can be expensive and complex. Further, since CVD growth processes often operate in the near-melting point regime of the substrate, substrate deformation can commonly occur, which can be undesirable for precision applications. CVD growth of graphene may not be possible at all on certain low melting substrates.

CVD is now one of the most reliable, scalable and rapid methods for large-area graphene growth. Thermal CVD generally involves growing graphene on a catalyst surface such as Cu, Ni, Ru, Pt, Ir, using a mixture of a hydrocarbon gas precursor and hydrogen at high temperatures (in the order of 1000° C.). After the growth, graphene can be transferred to a desired substrate by various processes, e.g., wet-etching of the metal catalyst. While thermal CVD can yield high quality graphene over a large area, the transfer step is not desirable since it can degrade the quality of the film by introducing defects and contamination. In addition to requiring a catalyst, in the thermal CVD process, the high temperature of growth also limits the type of growth substrates. To enable facile graphene integration into commercial devices, it is advantageous to reduce the growth temperature thereby increase the potential substrates and further avoid the necessity of the transfer operation from a catalyst to a substrate.

Therefore, there is an unmet need for a novel scalable approach for generating graphene that overcomes the above-discussed shortcomings.

SUMMARY

A graphene deposition process is described herein. The process includes the steps of placing a substrate into a deposition chamber and heating the chamber. The process further includes generating radio frequency plasma at a location proximate to the substrate while flowing a precursor gas containing carbon through the plasma and over the substrate.

BRIEF DESCRIPTION OF DRAWINGS

FIGS. 1f, 1g, and 1h are graphs that statistically (i.e., frequency of occurrence) express area of graphene islands in nm$^2$ (1f), distance to the nearest island in nm (1g), and height of the island in nm (1h).

DETAILED DESCRIPTION

Figure 1A:
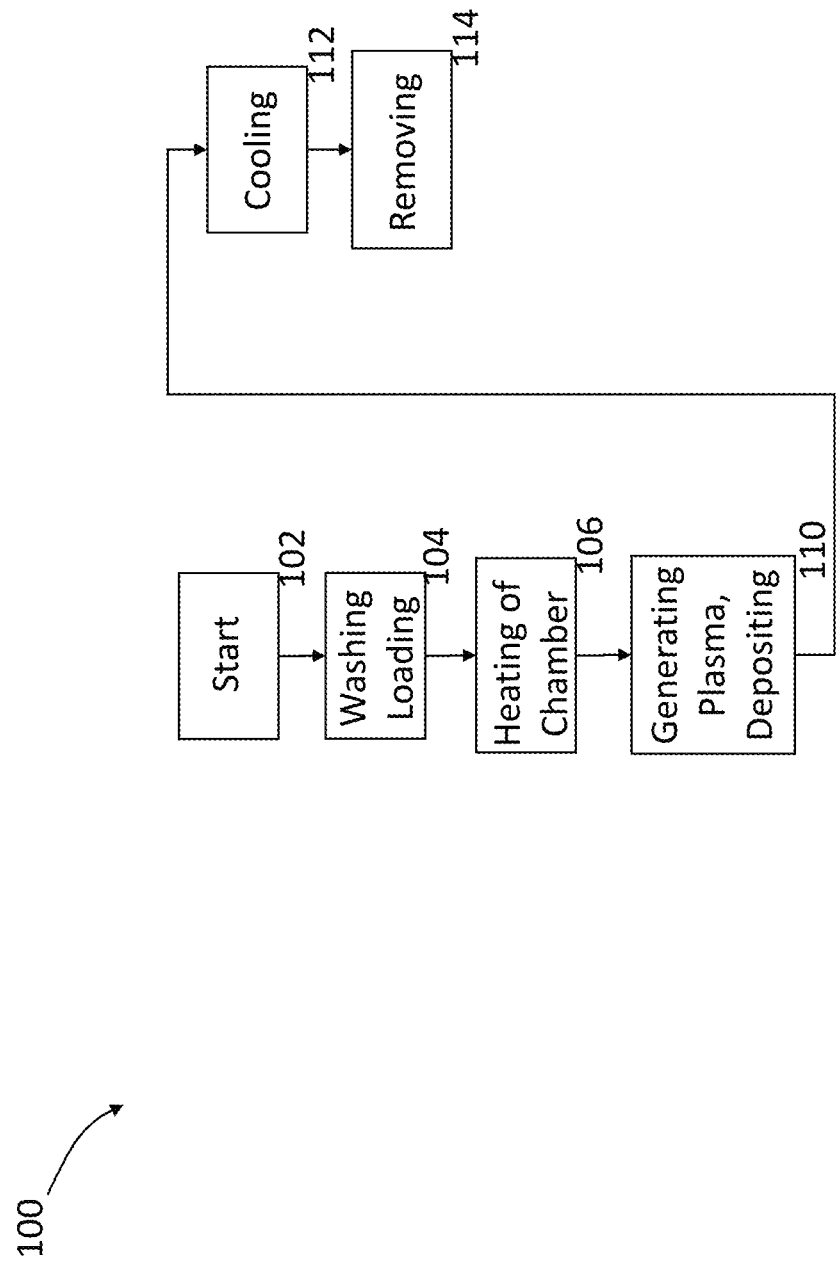
FIG. 1a is a process flowchart which depicts steps involved in generating graphene, according to the present disclosure.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%, within 95%, or within 99% of a stated value or of a stated limit of a range.

A novel scalable approach for generating graphene that overcomes the above-discussed shortcomings is presented. A plasma-enhanced chemical vapor deposition (PECVD) process is described herein that can generate graphene on a substrate at relatively low temperatures without the use of a catalytic layer. According to the present disclosure, a process for growth of few-layer graphene (FLG—less than 10 layers) and multilayer graphene (MLG—more than 10 layers) is described at deposition temperatures ranging between 200-1000° C. using a plasma-enhanced CVD on both non-catalytic and traditional catalytic substrates within a few minutes, e.g., 1-15 minutes depending on the particular substrate chosen. This approach provides a one-step method towards catalyst-free, rapid growth of multilayer graphene at reduced temperatures. Raman spectroscopy, Scanning Electron Microscopy (SEM) and optical measurements were used to analyze the progression of graphene growth with time, providing a striking contrast with the self-limiting scheme observed in thermal CVD.

Referring to FIG. 1a, a process flowchart 100 is provided which depicts steps involved in generating graphene, according to the present disclosure. The process starts in the block 102. As a first step, in block 104, the substrate upon which the graphene is to be deposited is initially washed with a i) solvent, e.g., using a triple sonication wash in toluene, acetone and methanol or isopropyl alcohol for 5 min each; or ii) with an etching solution, e.g., piranha etch, or other solutions known to a person having ordinary skill in the art. The substrate is then loaded into a heating-plasma chamber for further processing.

Next, in block 106, the chamber within which graphene is to be deposited on to the loaded substrate is heated. An example of such a chamber is EASYTUBE® 3000 FIRST NANO® system, utilizing a 6-inch diameter quartz furnace with a radio frequency (RF) plasma generator, e.g., at about 13.56 MHz, or other suitable and industrial heating chambers as known to a person having ordinary skill in the art. The chamber is then heated to about 650° C. in about 20 min and evacuated in a flow of 1 slpm of Ar at 300 mTorr. Other gases known to a person having ordinary skill in the art can also be used.

The temperature to which the chamber is heated determines the grain size of the graphene that will be deposited. Higher temperatures result in higher grain sizes which in turn result in a smaller number of grain boundaries, thereby resulting in a more efficient current density once the graphene is used in an electronic device. However, high temperatures may be unsuitable for some substrates. Therefore, a balance between grain size and choice of substrate is achieved by determining the optimum heating temperature. It should be appreciated that temperature ranging between 200 and 1000° C. are within the scope of the present disclosure for substrates ranging from 1) metal-based material, 2) insulators, and 3) semiconductor-based material. These three categories include: 1) Copper, Aluminum, Nickel, Titanium, Titanium Nitride, Cobalt, Ruthenium, Platinum, Iridium, and Silver; 2) SiO$_2$, Sapphire, MgO, and Quartz; and 3) Silicon, Silicon Carbide, III-V semiconductors such as GaAs, and GaN, respectively. Another factor that affects the operational temperature and growth of graphene is the choice of the precursor gas. For example, in accordance with another embodiment of the present disclosure, MLG films were directly deposited onto SiO$_2$ at a lower temperature of 550° C., using C$_2$H$_2$ as the precursor gas.

When the temperature reaches a predetermined set point, Ar flow is shut off. To begin the deposition process of graphene, a precursor gas containing carbon is injected into the chamber while RF plasma is generated, as shown in Block 110. The plasma can be generated remotely from the substrate upstream, where at plasma species are generated away from the substrate and any graphene already deposited to avoid ion bombardment damage further providing independent control of the substrate temperature; or near the substrate. The reflected RF power can be minimized using a matching network for maximum plasma efficiency. The precursor gas, is injected into the chamber at a predetermined partial pressure and flow rate. In one exemplary embodiment, $CH_4$ is used as the precursor gas at about 1 mTorr (other pressures from $10^{-04}$ to 1 Torr are also within the scope of this disclosure) and at about a flow rate of about 6 sccm. However, other precursor gases such as $C_2H_2$, $C_2H_4$, $C_2H_6$, or other suitable gases known to a person having ordinary skill in the art can also be used. At a predetermined growth period, the precursor gas, e.g., $CH_4$, flow is shut off and the chamber is evacuated using, e.g., Ar gas. Subsequently, the chamber is cooled down at a predetermined rate, e.g., about 15° C./min with a flow of about 100 sccm of Ar at a pressure of about 1 Torr, as provided in Block 112. Substrates with deposited graphene are then removed from the CVD chamber at temperatures below about 150° C., as provided in block 114.

One important aspect of the process described according to FIG. 1a is the ability to grow graphene on a substrate of choice without a catalytic interface. This process facilitates dismissal of myriad issues associated with use of a catalytic interface and thereby disassociation of graphene from the catalytic interface such as introduction of unwanted contamination and defects. Furthermore, the process according to the present disclosure can be accomplished at relatively low temperatures as compared to prior art CVD processes, e.g., as low as about 200° C. This low temperature provides the flexibility of certain substrate choices not available at the traditional temperatures seen in traditional CVD processes, e.g., 1500° C. Furthermore, deposition (and hence growth time) are reduced to minutes, e.g., according to one embodiment of about 1 to about 15 minutes, vs. hours making this process scalable for high volume fabrication processes.

According to one exemplary embodiment, using 550 W of plasma power both FLG and MLG growth on non-catalytic substrates, e.g., $SiO_2$ (90 nm thick), and quartz (1 mm thick), are achieved. The plasma power can range from between 10-1000 W.

In addition to non-catalytic deposition, the process described herein is also capable of a depositing graphene on substrates typically used as a catalyst in a catalytic deposition. The process was reduced to practice with growth on 500 nm thick physical-vapor-deposited copper (Cu) films on $SiO_2$—Si substrates. A Ta underlayer of about 5 nm thick was deposited to promote Cu adhesion. Results of these and non-catalytic depositions are provided below using Raman spectroscopy, Scanning Electron Microscopy (SEM) and optical measurements.

Raman spectroscopy was carried out in ambient environment at room temperature to determine the effectiveness of the deposition process of the present disclosure. A 532 nm Diode pumped solid state (DPSS) green laser beam was focused on substrates before and after graphene was deposited thereon by an objective, e.g., OLYMPUS® 50× objective (NA=0.75, WD=0.38 mm). The excited Raman scattering was collected by a Raman spectrometer, e.g., HORIBA LABRAM HR800 Raman spectrometer with an 1800 $mm^{-1}$ grating (spectral resolution=0.27 $cm^{-1}$). Transmission measurements were performed using a commercially available spectrophotometer, e.g., PERKIN ELMER Lambda 950 spectrophotometer having an integrating sphere. Transmission electron microscopy (TEM) sample was made by FIB system, e.g., FIB-SEM NOVA 200 and $SiO_2$ and Pt layers were deposited to protect the TEM sample area during ion-beam milling. High resolution microscopy was performed with a TEM, e.g., a JEOL ARM200F operated at 200 kV. For X-ray photoelectron spectroscopy (XPS) studies, the photoelectrons were excited using an Mg-Ka (energy=1253.6 eV) X-ray radiation source (SPECS XRC-1000) and analyzed using an electron analyzer, e.g., a OMICRON ARGUS hemispherical electron analyzer with a round aperture of 6.3 mm. X-Ray Diffraction (XRD) measurements were carried out in a commercially available XRD analyzer, e.g., a BRUKER D8 XRD set-up using mixed Cu-Kα line (wavelength=0.151838 nm).

Figure 1B:
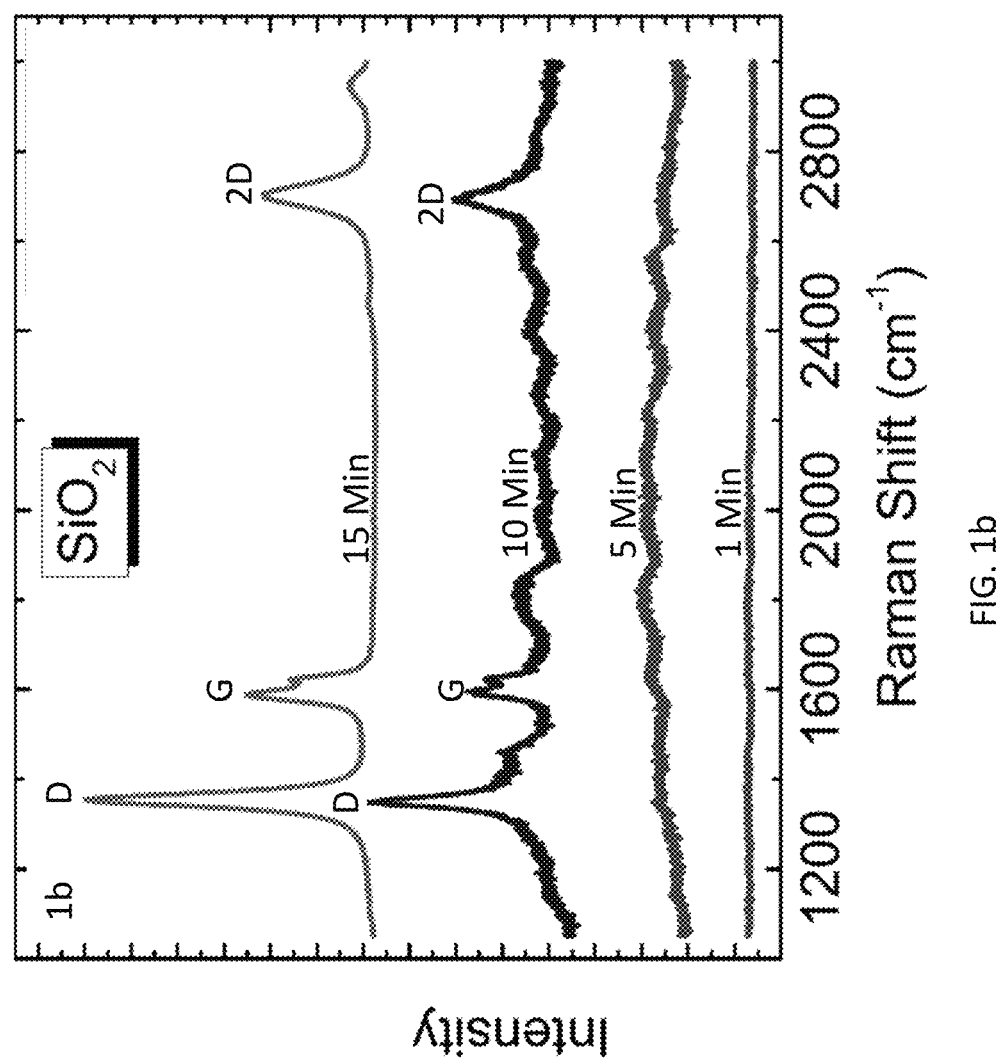
FIG. 1b is a Raman spectroscopy output of intensity vs. Raman shift measured in cm$^{-1}$ which depicts different growth periods of graphene on SiO$_2$ for 1 min, 5 min, 10 min, and 15 min.

Referring to FIG. 1b, a Raman spectroscopy output of intensity vs. Raman shift measured in $cm^{-1}$ is provided for different growth periods of graphene on $SiO_2$ for 1 min, 5 min, 10 min, and 15 min. The Raman spectrum of graphene has three dominant peaks, denoted by D, G and 2D at around 1350 $cm^{-1}$, 1600 $cm^{-1}$ and 2690 $cm^{-1}$, respectively. The Raman spectra provided no Raman signals from the substrate for about 1-min and about 5-min growths on $SiO_2$, indicating no graphene growth. For longer growth time (greater or equal to about 10 min), clear Raman signals are observed, providing concrete evidence that graphene is deposited. It should be appreciated that graphene in this case was deposited without a catalytic interface. It should also be appreciated that the deposition time (i.e., the time period for which the precursor gas is flown over the substrate) is a predetermined time period based on the choice of the substrate as will be made apparent below. However, time periods of about 1 minute to about 30 minutes are within the scope of the present disclosure.

Figure 1C:
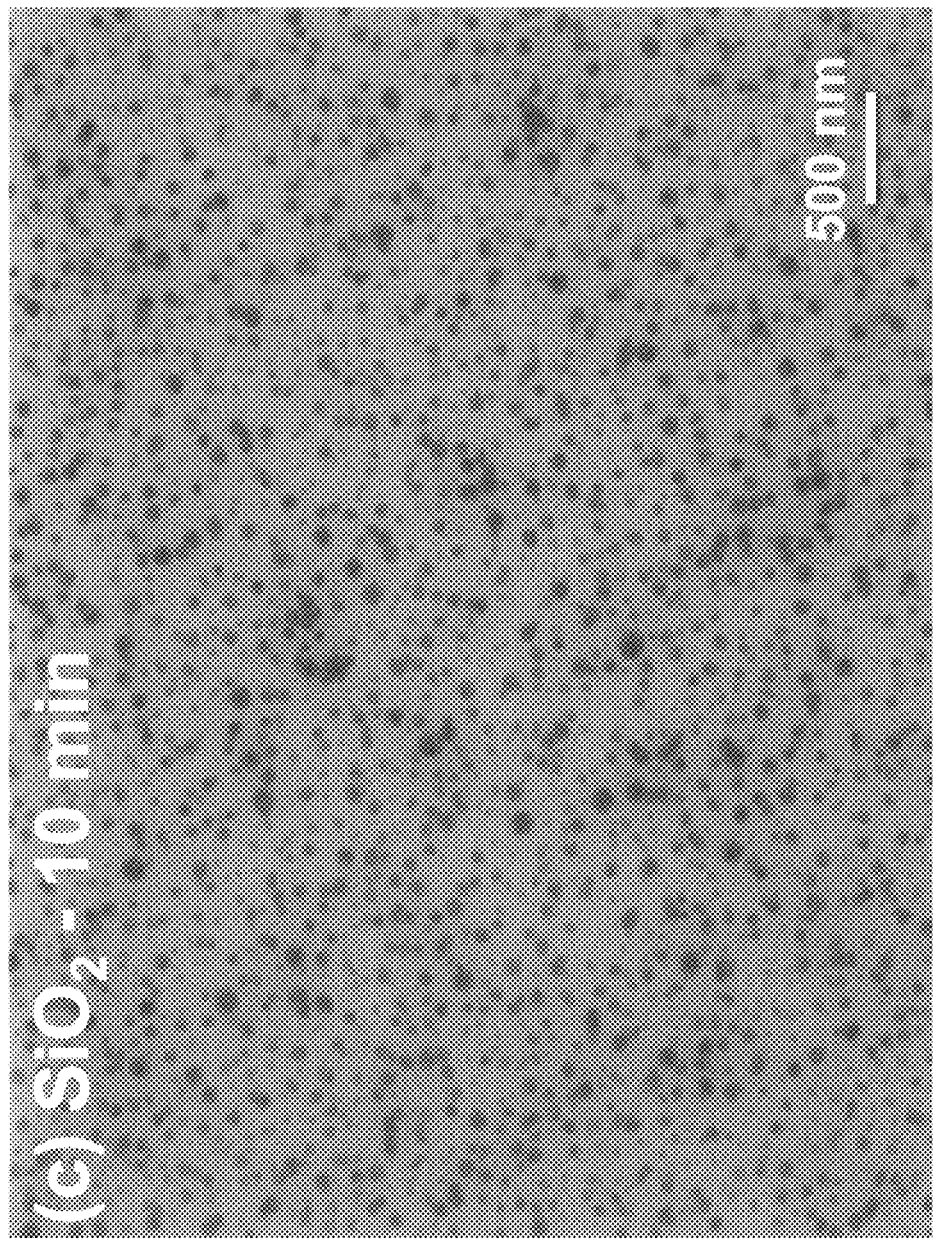
FIG. 1c is a top view scanning electron microscope (SEM) output depicting graphene growth.

Referring to FIG. 1c, a top view SEM output is provided. This visual evidence further substantiates formation of graphene layers starting from the initial stages of growth for the 10-minute growth trial as small graphene islands begin to appear on $SiO_2$ after 10 min of growth. Islands are disjointed clusters of graphene each containing multiple graphene grains of various sizes, e.g., 5-10, as further discussed below.

Figure 1D:
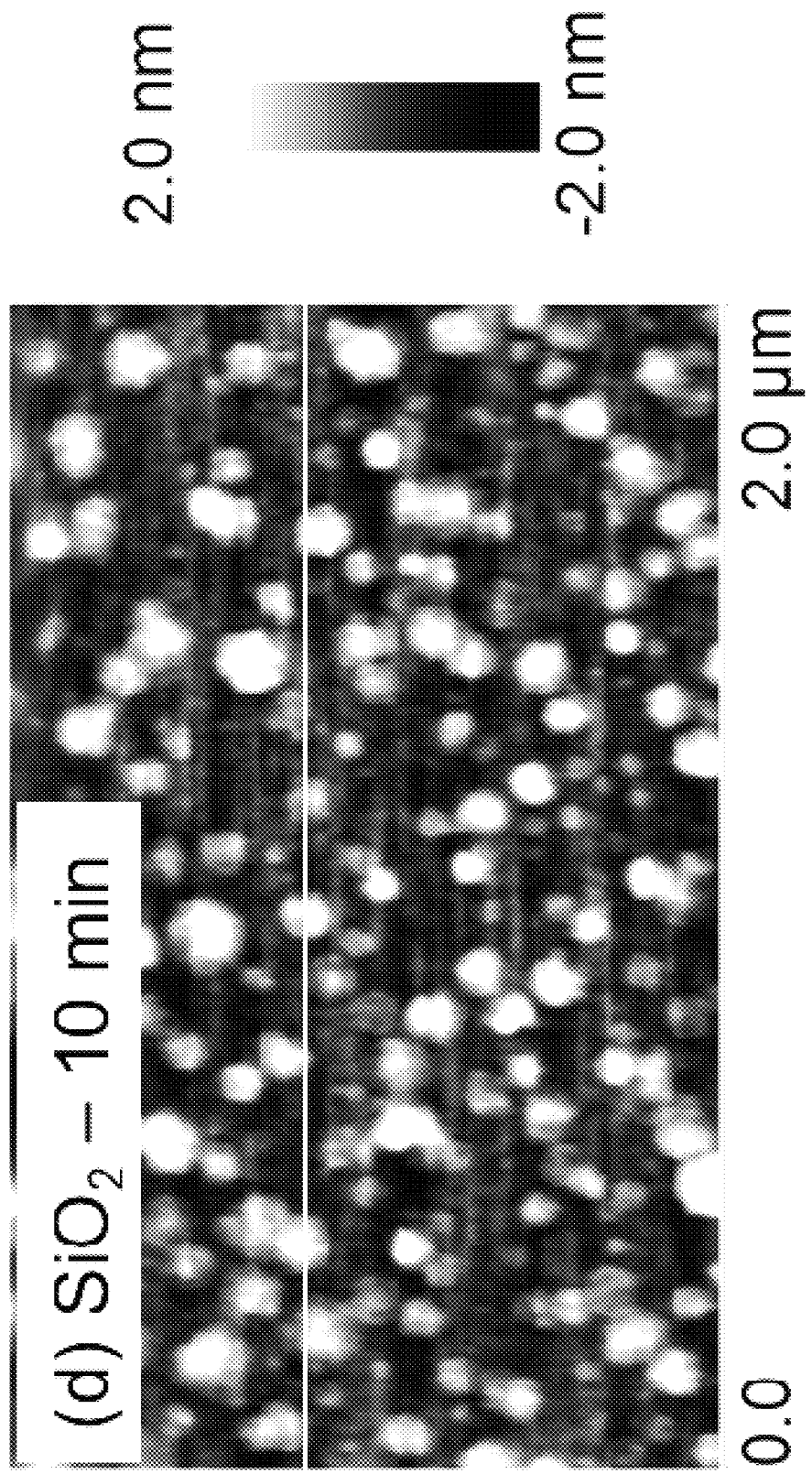
FIG. 1d is an atomic force microscopy (AFM) scan of a substrate with graphene grown thereon.
Figure 1E:
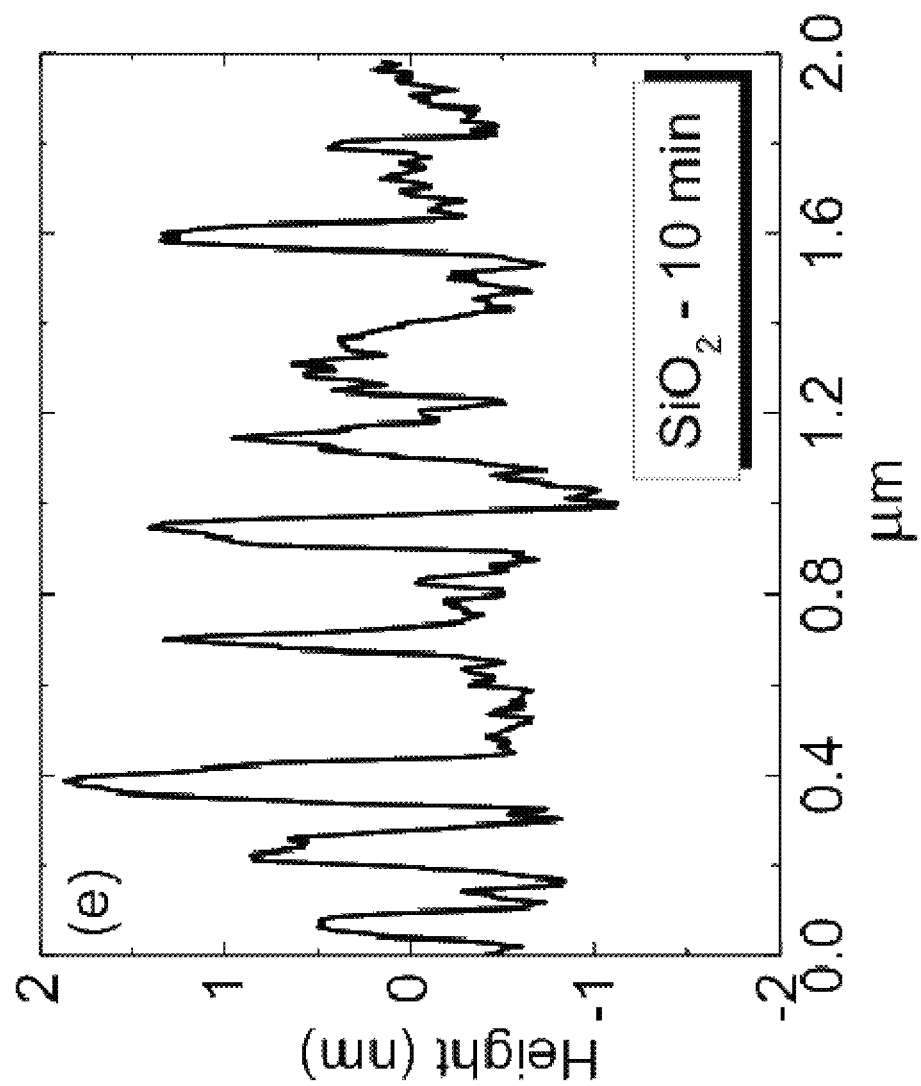
FIG. 1e is a graph of height of graphene grown on a substrate as a function of a linear scanning.

Referring to FIG. 1d, an atomic force microscopy (AFM) scan of the same substrate with graphene grown thereon is provided. FIG. 1e depicts a graph of height of graphene grown on the substrate as a function of a linear scanning. FIGS. 1d and 1e show that these graphene islands have a thickness of about 1-3 nm, indicating few-layer structures. Referring back to FIG. 1b, due to low coverage in the 10-minute sample, the corresponding Raman spectrum is rather noisy. The D-to-G intensity ratio of the Raman peaks of the 10-min sample can be approximately used to find the grain size of graphene. For the 532 nm Raman wavelength excitation, the grain size is calculated to be about 5-10 nm. These numbers are smaller than the size of the graphene islands observed under the SEM. Hence, these islands are not necessarily individual graphene grains but several grains merged together to form arbitrarily sized islands. As growth progresses, the island sizes increase.

A statistical analysis of the island size, spacing between islands and island height has been provided in FIGS. 1f, 1g, and 1h, which statistically (i.e., frequency of occurrence) express area of graphene islands in $nm^2$, distance to the nearest island in nm, and height of the island in nm, respectively. The majority of the islands formed after about 10-min growth on the $SiO_2$ substrate are few tens of nanometers in sizes, with sub-100 nm to 100 nm spacing.

Figure 2A:
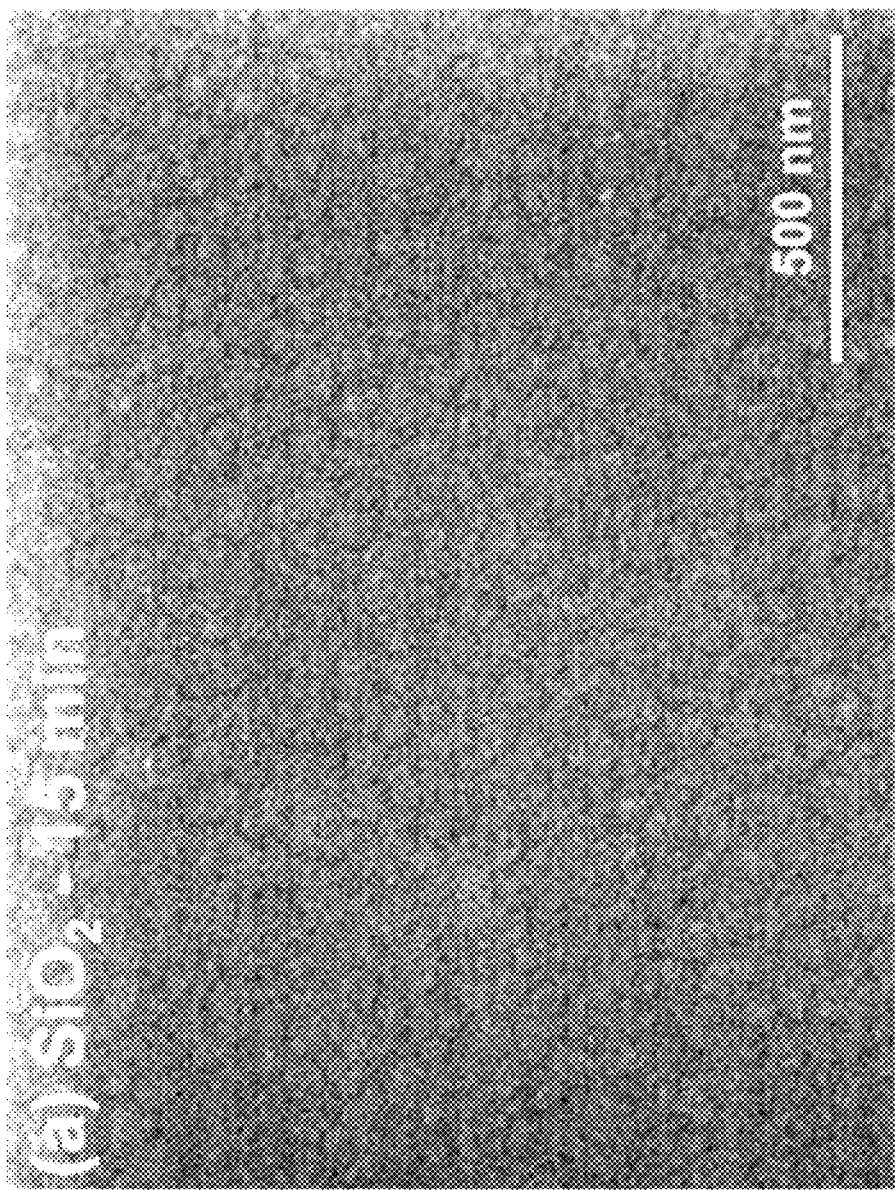
FIG. 2a is an SEM image of further growth from 10 minutes to 15 minutes on an SiO$_2$ substrate.
Figure 2B:
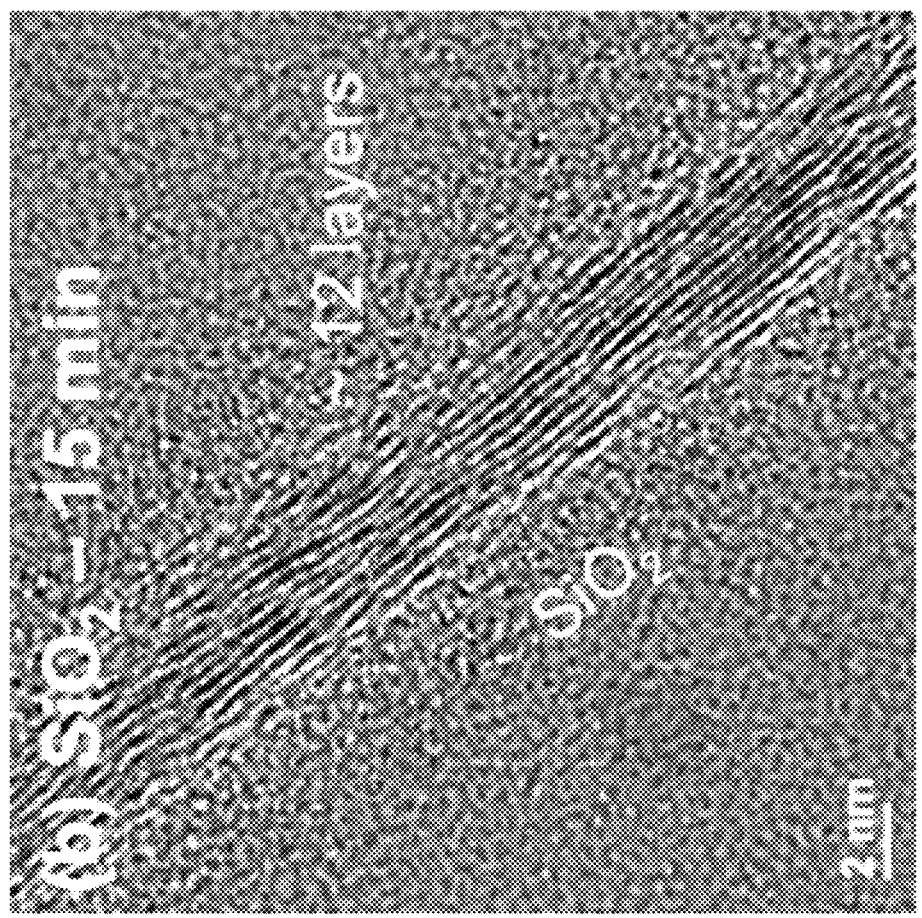
FIG. 2b is a TEM image of a 15-minute growth trial on an SiO$_2$ substrate.

Referring to FIG. 2a, an SEM image of further growth from 10 minutes to 15 minutes on $SiO_2$, shows the already formed graphene islands coalesce to entirely cover the $SiO_2$ surface (yet with visible boundaries between islands, achieving a complete coverage and yielding sharp Raman peaks, as shown in D, G, and 2D peaks of FIG. 1b for the 15-minute trial. A TEM image of the 15-minute trial is depicted in FIG. 2b. The layered structure of directly grown graphene is seen in the cross-sectional TEM of FIG. 2b, which shows that the 15-min $SiO_2$ sample has multiple graphene layers (12 layers).

Figure 2C:
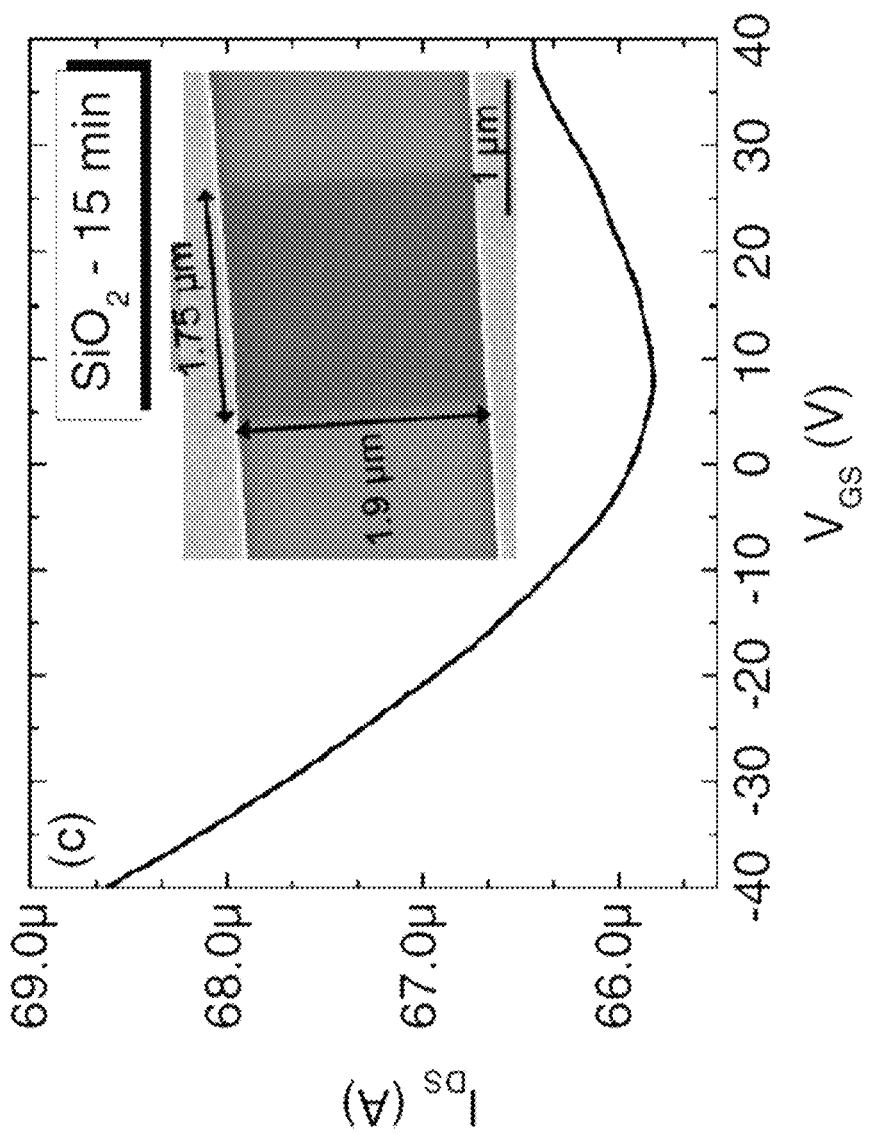
FIG. 2c is a graph of a device constructed by deposited graphene according to the present disclosure depicting source/drain current as a function of the Si back gate voltage with a drain voltage of 10 mV.

In order to investigate the efficacy of the graphene deposited on the $SiO_2$ substrate, the transport properties of the directly grown MLG in a back-gated field-effect transistor configuration was studied by patterning graphene channels formed from the 15-min $SiO_2$ substrate and depositing Ti/Au source-drain electrodes in a 2-probe arrangement. Referring to FIG. 2c the source/drain current as a function of the Si back gate voltage with a drain voltage of 10 mV is shown. The observed ambipolar nature of transport is a defining characteristic of a graphene-constructed device.

Figure 3A:
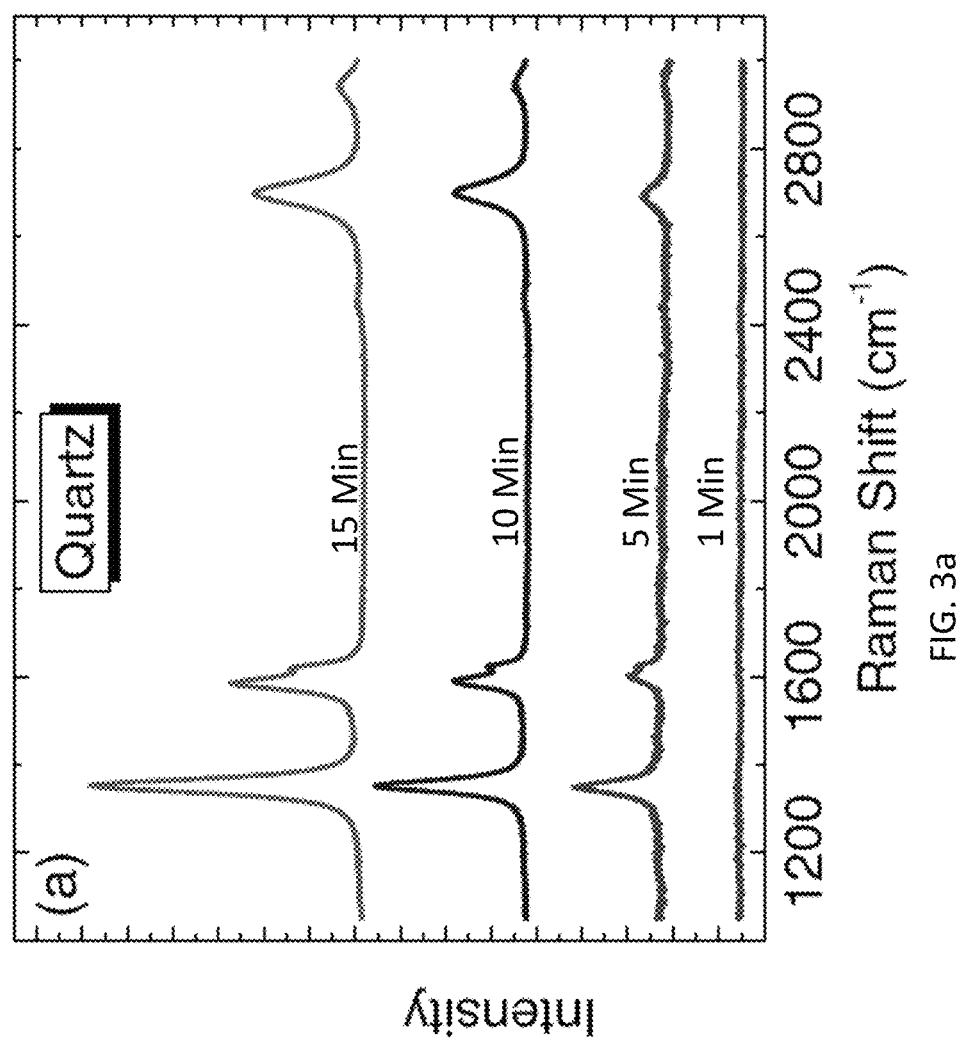
FIG. 3a is a Raman spectroscopy output of intensity vs. Raman shift measured in cm$^{-1}$ for different growth periods of graphene on quartz for 1 min, 5 min, 10 min, and 15 min trials.
Figure 3B:
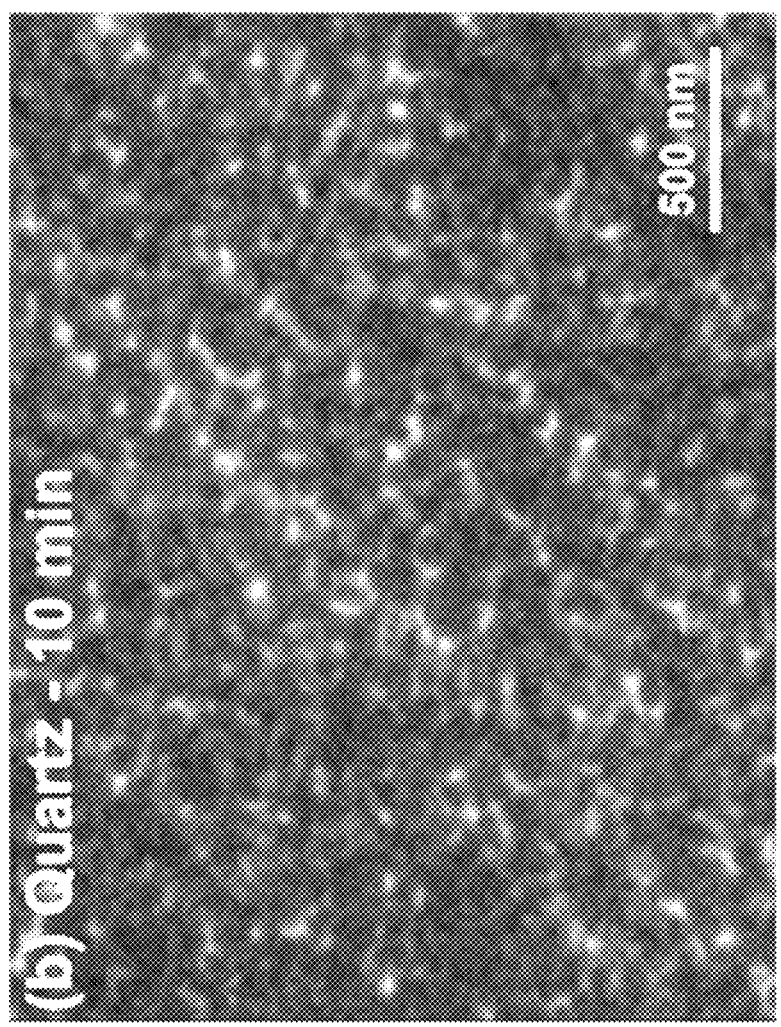
FIG. 3b is an SEM output for graphene grown on quartz for a 10-minute trial.
Figure 3C:
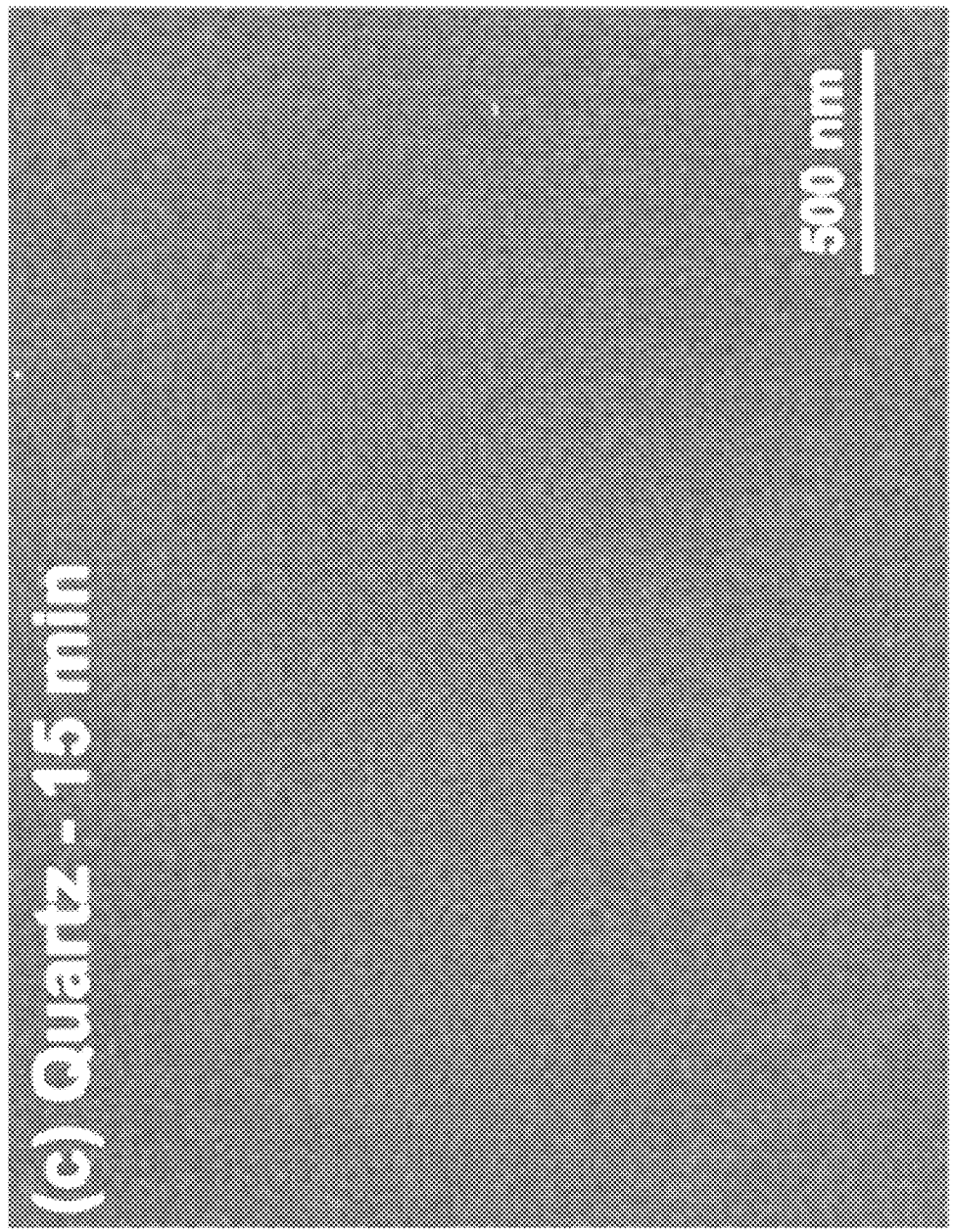
FIG. 3c is an SEM output for graphene grown on quartz for a 15-minute trial.

Referring to FIG. 3a, a Raman spectroscopy output of intensity vs. Raman shift measured in $cm^{-1}$ is provided for different growth periods of graphene on quartz for 1 min, 5 min, 10 min, and 15 min. Substantially identical growth recipes were used on quartz substrate and, in contrast to $SiO_2$, quartz as a substrate begins to show Raman peaks at a shorter growth time of 5 min compared to 10 min for $SiO_2$. Referring to FIG. 3b, an SEM output for graphene grown on quartz for a 10-minute trial are provided. As can be seen, 10 minutes allows well-connected graphene islands covering a large fraction of the substrate, in agreement with the distinct Raman peaks observed in FIG. 3a. Referring to FIG. 3c, an SEM output for graphene grown on quartz for a 15-minute trial are provided. Increasing the growth time to 15 min leads to a complete coverage of graphene on quartz. Based on the SEM and Raman results shown in FIGS. 3a, 3b, and 3c, quartz assists graphene growth faster than $SiO_2$.

Figure 4A:
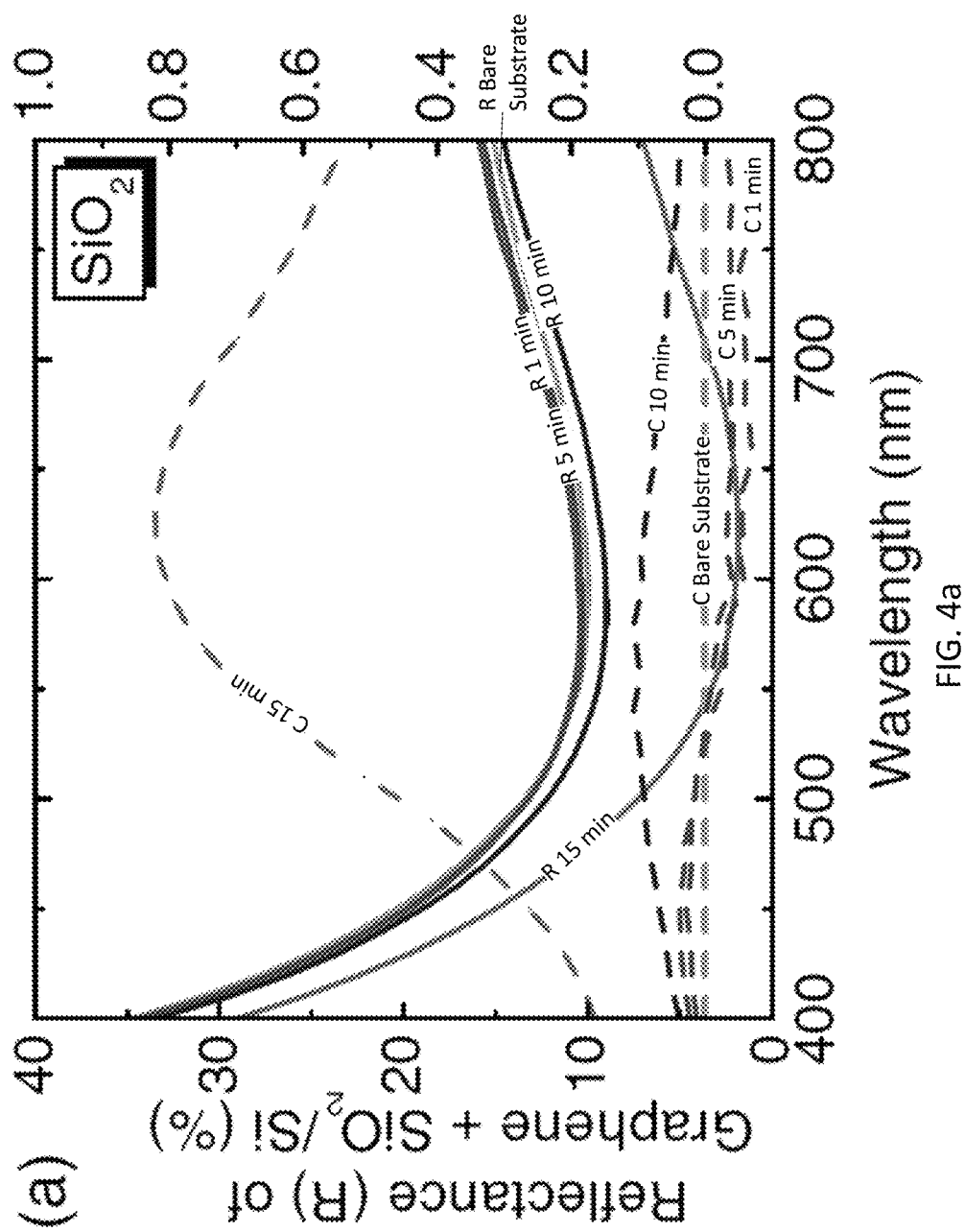
FIG. 4a are graphs of measured reflectance (associated with left axis) of graphene grown on an SiO$_2$ substrate and extracted contrast (dash lines associated with right axis) vs. wavelength measured in nm for various growth periods.

The growth of graphene as a function of growth time was further analyzed using optical measurements. Referring to FIG. 4a, graphs of measured reflectance of graphene grown on $SiO_2$ (associated with left axis) and extracted contrast $$\left(C = \frac{R_{Substrate} - R_{Gr+Substrate}}{R_{Substrate}}\right)$$

(dash lines associated with right axis) vs. wavelength measured in nm is shown for various growth periods. 1-10 min of growth on $SiO_2$ gives no appreciable change in contrast with respect to bare substrate in spite of the formation of small islands seen under the SEM. During the next 5 min, while the coverage becomes complete, a large change in contrast is observed, suggestive of MLG grown at that stage as confirmed by TEM (FIG. 2b).

Figure 4B:
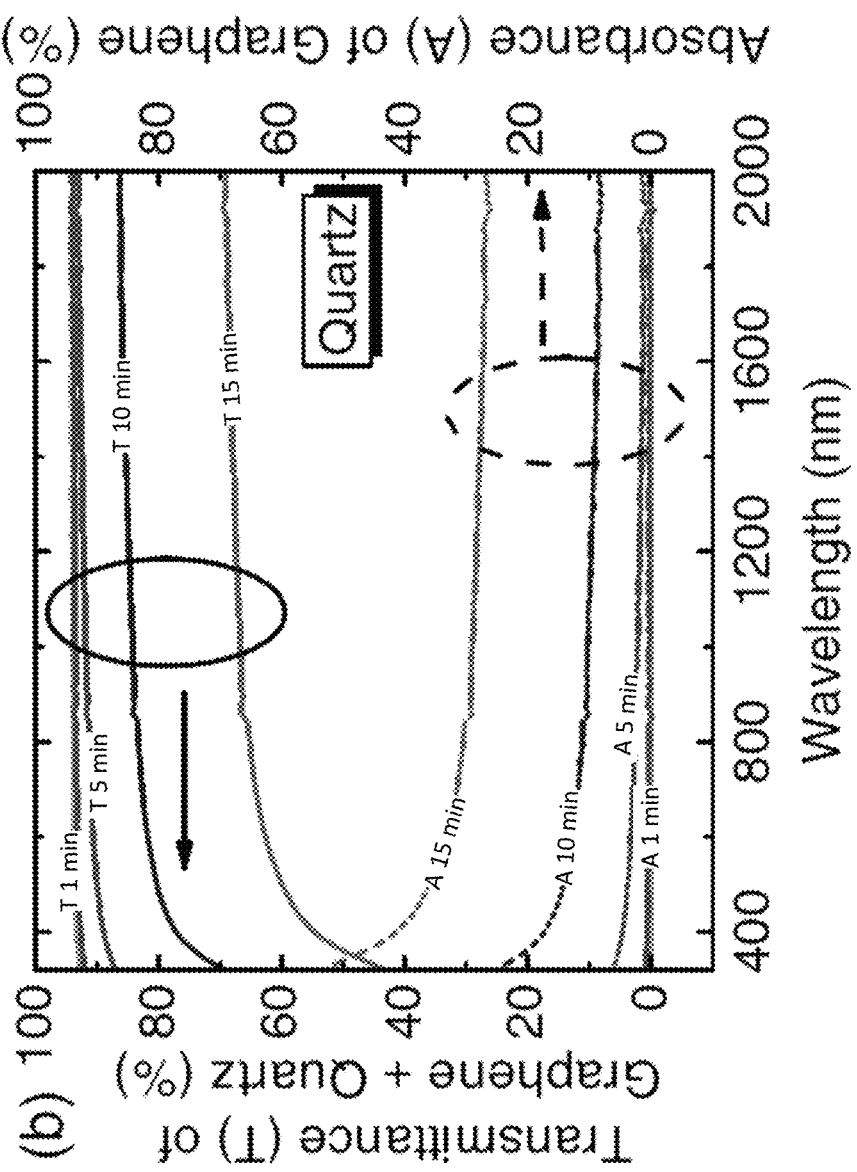
FIG. 4b are graphs of measured transmittance (associated with left axis) of graphene grown on a quartz substrate and extracted absorbance of graphene (associated with right axis—the bottom four traces) vs. wavelength measured in nm for various growth periods.

As a comparison and referring to FIG. 4b, measured transmittance and extracted absorbance $$\left(T_{Gr} = \frac{T_{Gr+Quartz}}{T_{Quartz}}, A_{Gr} = 1 - T_{Gr}, R_{Gr} \sim 0\right)$$

of graphene (the bottom four traces) grown on a quartz substrate is provided. From the extracted absorbance, it should be noted that the 1-min sample shows no graphene growth as further from its Raman spectrum (see FIG. 3a). Monolayer graphene absorbs about 2.3% of light in near-IR regime, hence, an absorption value of 9% shown by the 10-min sample would then correspond to 4 layers of graphene. However, since the growth is not yet complete at 10 min, it should be noted that the PECVD process yields few layer graphene islands during the initial stage of the growth, which have transmission equivalent to 4 uniform layers of graphene. This observation suggests that absorption cannot be used to quantitatively analyze the number of layers unless growth is confirmed to be uniform across the surface. As the time increases to 15 min, these islands grow in size and eventually merge together to give a complete coverage. Absorption in near-IR range also increases from 9% to 27%, suggesting a large increase in layer count. Moreover, the 15-min sample shows a sheet resistivity of 1.3 kohm $sq^{-1}$, which makes the directly grown PECVD graphene an ideal candidate for transparent conductive electrodes. Furthermore, in spite of the large number of layers, both $SiO_2$ and quartz samples show very high 2D-to-G peak intensity ratios and small 2D peak-widths in their Raman spectra. The multi-layer graphene grown on non-catalytic substrates is turbostratic (random angle of orientation between layers), thereby resulting in the high 2D-to-G ratio.

Figure 5A:
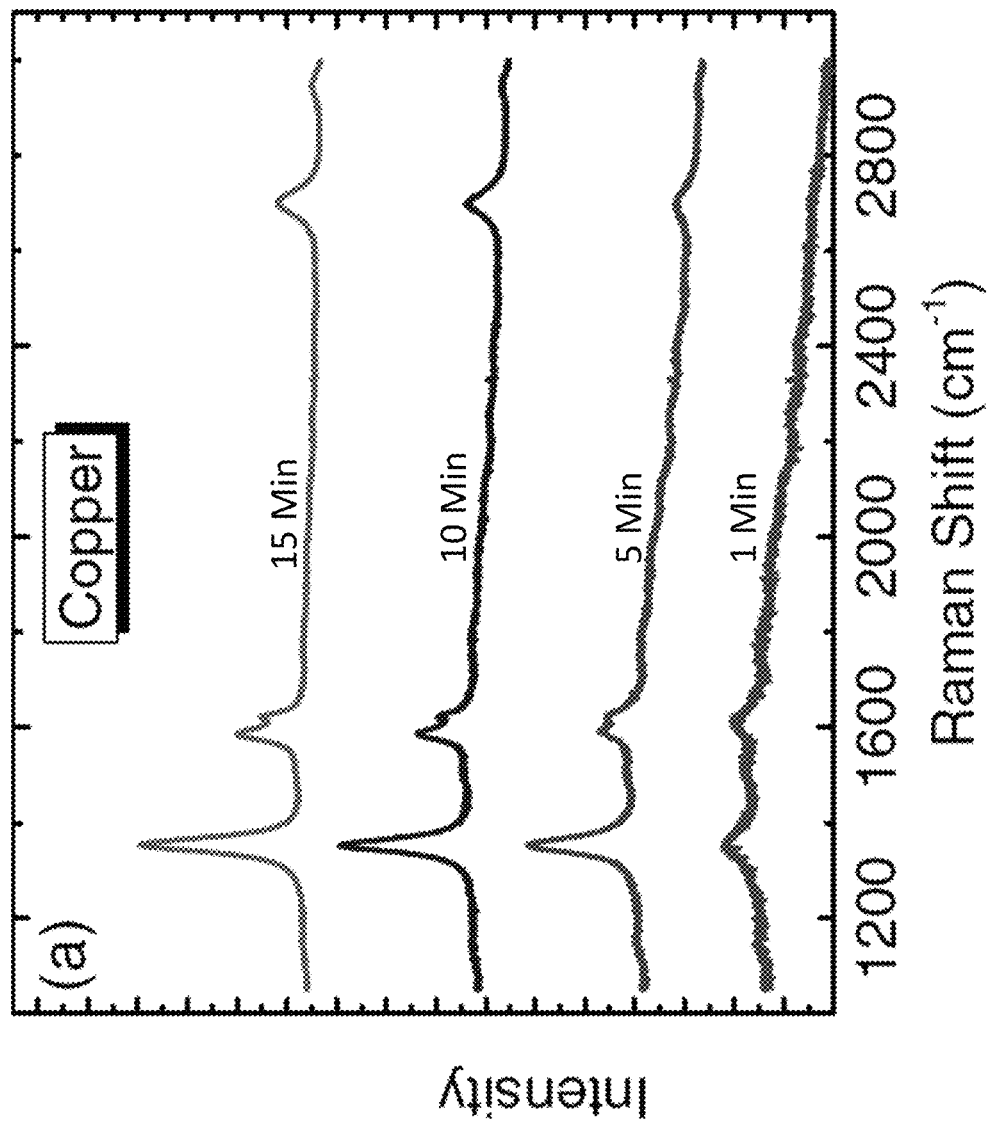
FIG. 5a is a Raman spectroscopy output of intensity vs. Raman shift measured in cm$^{-1}$ for different growth periods of graphene on Cu for 1 min, 5 min, 10 min, and 15 min trials.
Figure 5B:
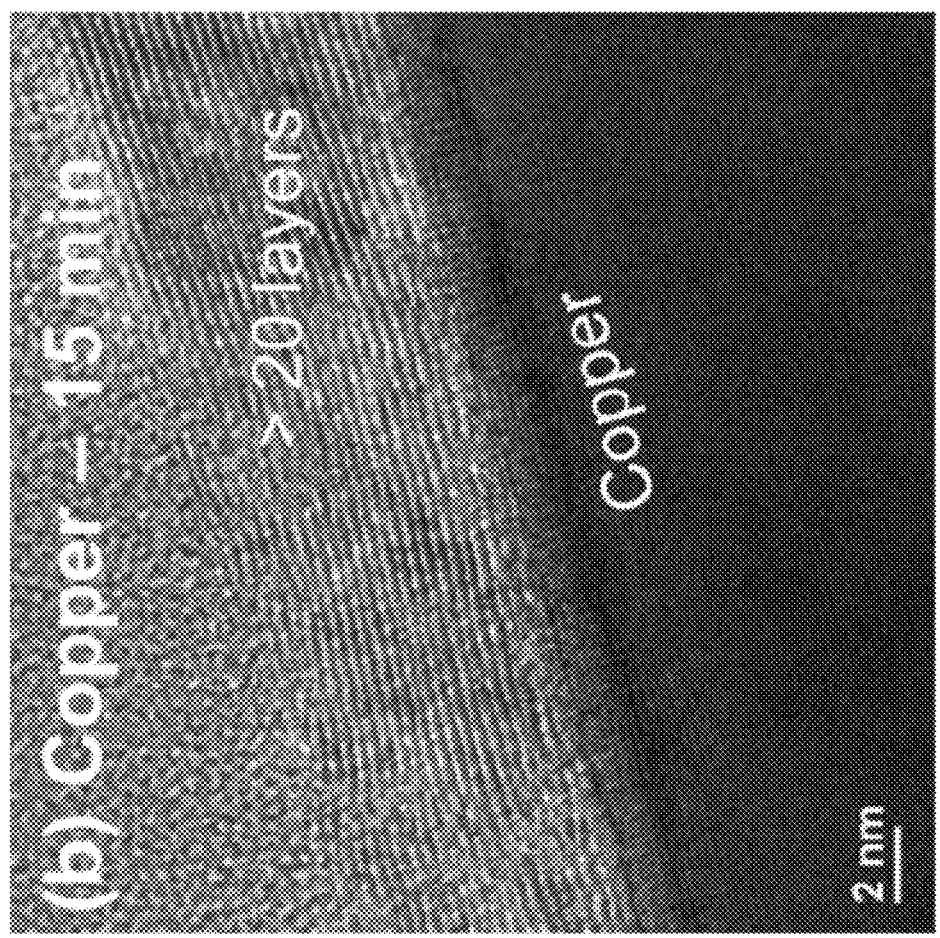
FIG. 5b is a TEM image of the 15-minute trial for graphene grown on Cu.

In order to test the efficacy of the process according to the present disclosure with catalytic interfaces, substantially identical growth processes were simultaneously carried out on Cu films to study the impact of traditional metal catalysts. In order to verify complete coverage of graphene, Cu samples were heated at 180° C. in ambient conditions for 30 min. Graphene, which acts as a passivation barrier, prevents the oxidation of Cu. The heating test was performed on all Cu samples and it was found that even 5 min of growth prevents Cu oxidation, indicating complete coverage of graphene on Cu. This result serves as a clear evidence of faster graphene growth on Cu than on quartz and, by extension, on $SiO_2$ as well. Referring to FIG. 5a, a Raman spectroscopy output of intensity vs. Raman shift measured in $cm^{-1}$ is provided for different growth periods of graphene on Cu for 1 min, 5 min, 10 min, and 15 min. Measurements were acquired directly on the substrate to avoid any defects induced by graphene transfer. It can be seen that even 1 min of growth on Cu shows D and G peaks, albeit with low intensity because of the incomplete growth. Referring to FIG. 5b, a TEM image of the 15-minute trial for graphene grown on Cu is provided. As seen in FIG. 5b, provides more than 20 layers after about 15-min PECVD growth, according to the present disclosure to be contrasted with the case of Cu in traditional CVD, which is generally self-limiting for thermal CVD. Consequently, the results according to the present disclosure prove that PECVD growth is not self-limiting and the number of layers can be tuned by simply changing the duration of growth, an advantage of the process according the present disclosure over the thermal CVD provided in the prior art.

Figure 5C:
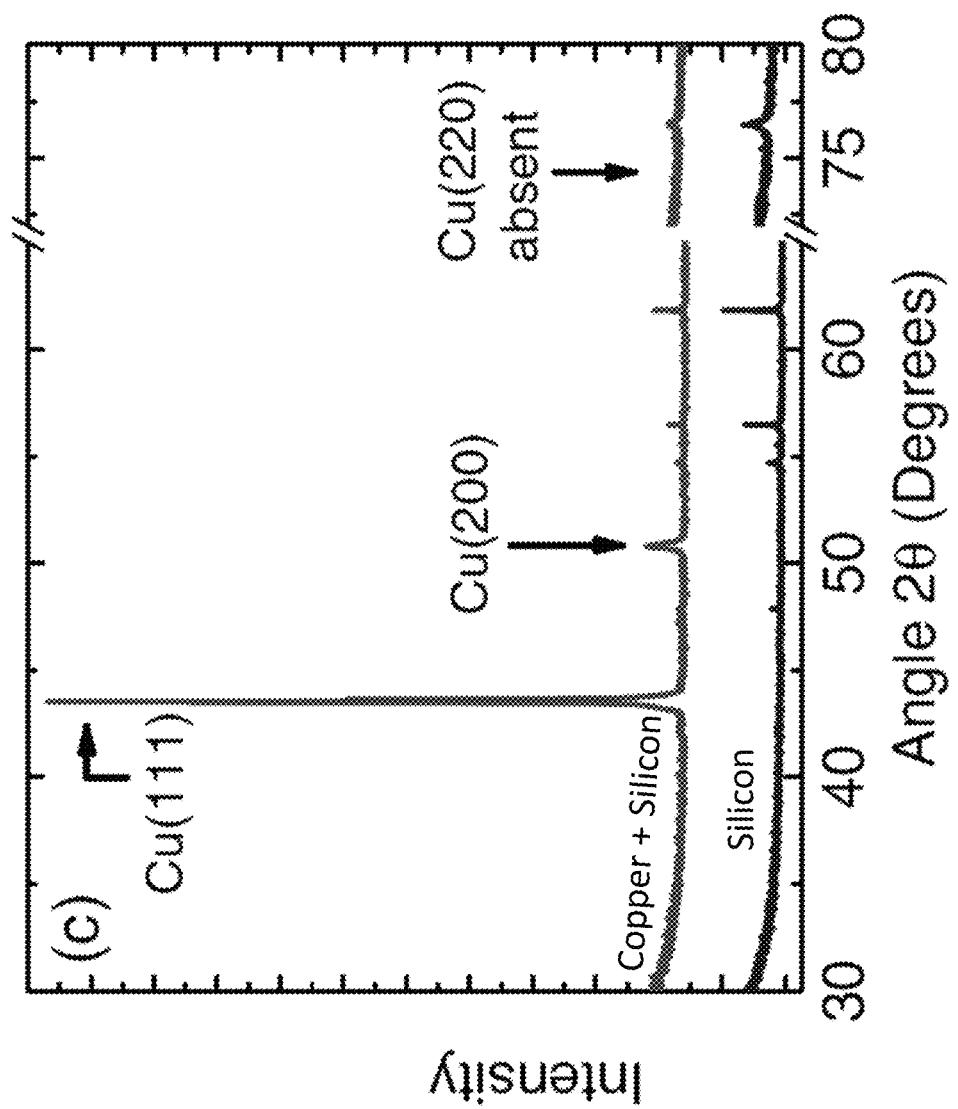
FIG. 5c is an XRD output comparing intensity vs. angle measured in degrees for Cu on Si and Si.

To further understand the improved graphene deposition on Cu, XRD measurements carried out on the Cu sample just after about 1-min growth revealed that Cu's crystal orientation is mostly (111) even during the initial stages. Referring to FIG. 5c, an XRD output comparing intensity vs angle measured in degrees for Cu on Si and Si is provided. As a result, enhanced adsorption and high diffusion of carbon species on Cu (111) is a major factor for the high growth rate of graphene when compared to arbitrary substrates, e.g. Si. The high D-peak observed in the Raman spectra of the samples discussed above signifies the nano-crystalline nature of PECVD graphene which is a direct consequence of the high carbon flux in $CH_4$ plasma and the low growth temperature, thus leading to high nucleation density and small grain sizes. This is followed by further adsorption of carbon species on the host substrate that can attach to the edges of the islands or direct adsorption on top of graphene islands to induce multi-layer growth. Once the substrate is entirely covered with graphene, interaction of incoming carbon species with substrate vanishes which leads to these incoming carbon species being directly adsorbed on existing graphene layers and facilitating growth of top layers.

Those having ordinary skill in the art will recognize that numerous modifications can be made to the specific implementations described above. The implementations should not be limited to the particular limitations described. Other implementations may be possible.

The invention claimed is:

1. A graphene deposition process, comprising:
placing a substrate suitable to be heated only up to about 200° C. into a deposition chamber;
heating the chamber up to about 200° C.; and
generating radio frequency plasma at a location proximate to the substrate while flowing a precursor gas containing carbon through the plasma and over the substrate,
wherein the precursor gas is flown through the plasma and over the substrate for a predetermined period of time, ranging between about 1 to about 30 minutes,
wherein the precursor gas is flown over the substrate at a partial pressure of about 1 mTorr,
wherein the precursor gas is flown over the substrate at a flow rate of about 6 sccm, and
wherein the precursor gas is selected from the group consisting of $CH_4$, $C_2H_2$, $C_2H_4$, and $C_2H_6$.

2. The process of claim 1, the substrate is a metal selected from the group consisting of Copper, Aluminum, Nickel, Titanium, Titanium Nitride, Cobalt, Ruthenium, Platinum, Iridium, and Silver.

3. The process of claim 1, the substrate is an insulator selected from the group consisting of $SiO_2$, Sapphire, MgO, and Quartz.

4. The process of claim 1, the substrate is a semiconductor selected from the group consisting of Silicon, Silicon Carbide, and GaAs.

5. The process of claim 1, prior to placing the substrate into the deposition chamber, comprising: washing the substrate with i) solvents; or ii) an etching solution.

6. The process of claim 5, the solvent is selected from the group consisting of Toluene, Acetone, Methanol and Isopropyl alcohol; and the etching solution is piranha etch.

7. The process of claim 1, the radio frequency plasma is generated at about 13.56 MHz.

8. The process of claim 1, the plasma is generated upstream from the substrate.

9. The process of claim 1, the plasma is generated adjacent to the substrate.

10. The process of claim 1, the predetermined period of time is between about 1 to about 15 minutes, when the substrate is copper.

11. The process of claim 1, the predetermined period of time is between about 5 to about 15 minutes, when the substrate is Quartz.

12. The process of claim 1, the predetermined period of time is between about 10 to about 15 minutes, when the substrate is $SiO_2$.

* * * * *